United States Patent
Ito et al.

(10) Patent No.: US 6,949,487 B2
(45) Date of Patent: Sep. 27, 2005

(54) DIELECTRIC CERAMIC COMPOSITION

(75) Inventors: Kazuhiro Ito, Sagamihara (JP); Hitoshi Masumura, Niigata (JP)

(73) Assignee: Koninklijke Philips Electronics N.V., Eindhoven (NL)

( * ) Notice: Subject to any disclaimer, the term of this patent is extended or adjusted under 35 U.S.C. 154(b) by 29 days.

(21) Appl. No.: 10/487,172

(22) PCT Filed: Aug. 19, 2002

(86) PCT No.: PCT/IB02/03332

§ 371 (c)(1), (2), (4) Date: Feb. 17, 2004

(87) PCT Pub. No.: WO03/018507

PCT Pub. Date: Mar. 6, 2003

(65) Prior Publication Data

US 2004/0242402 A1 Dec. 2, 2004

(30) Foreign Application Priority Data

Aug. 21, 2001 (JP) .......................................... 2001-250312

(51) Int. Cl.[7] ....................... C04B 35/468; B32B 18/00; H01Q 23/00
(52) U.S. Cl. ....................... 501/137; 501/138; 501/139; 361/321.4; 361/321.5; 428/471; 428/697; 343/700 R; 343/785
(58) Field of Search ................................ 501/137, 138, 501/139; 428/471, 697; 361/321.4, 321.5; 343/700 R, 785

(56) References Cited

U.S. PATENT DOCUMENTS 5,378,663 A * 1/1995 Abe et al. ...................... 501/32
5,635,433 A * 6/1997 Sengupta ...................... 501/137
6,613,705 B1 * 9/2003 Feltz et al. .................... 501/32
6,642,167 B1 * 11/2003 Sugimoto et al. ........... 501/138
6,797,661 B2 * 9/2004 Mikkenie et al. ........... 501/139
6,828,266 B1 * 12/2004 Park et al. ................... 501/139

* cited by examiner

*Primary Examiner*—David Brunsman

(57) ABSTRACT

It is an object of the invention to provide a dielectric ceramic composition which enables its firing temperature to be lowered and which has an excellent electrical properties, particularly temperature dependence of resonance frequencies. A dielectric ceramic composition according to the invention comprises an oxide of a barium titanate family having a composition formula represented as $BaTi_xO_{2x+1}$ ($3.5 \leq x \leq 5.0$); a first chemical element group consisting of at least one kind of alkaline-earth metals, silicon, zinc, aluminium, titanium, copper, bismuth and molybdenum; and a second chemical element group consisting of at least one kind of alkali metals and boron. A weight ratio of a total of each chemical element in the first and second chemical element groups to the oxide (the total of each chemical element/the oxide) is between 45/55 and 65/35 inclusive when the ratio is determined by converting said each chemical element to its oxide. A weight ratio of the second chemical element group to the first chemical element group (the second chemical element group/the first chemical element group) is between 0.01 and 0.10 inclusive when the ratio is determined by converting said each chemical element to its oxide.

5 Claims, 4 Drawing Sheets

| | first chemical element group (wt%) | second chemical element group (wt%) | total of the first and second chemical element groups (wt%) | BaTi$_4$O$_9$ (wt%) | second chemical element group / first chemical element group | firing condition temp. (°C) | firing condition time (hour) | Q-value at 1 GHz | relative dielectric constant at 1 GHz | τf at 1 GHz (ppm/°C) |
|---|---|---|---|---|---|---|---|---|---|---|
| Example 1 | 63.3 | 0.7 | 64.0 | 36.0 | 0.011 | 900 | 2 | 20000 | 24 | −5 |
| Example 2 | 61.7 | 2.3 | 64.0 | 36.0 | 0.037 | 880 | 2 | 17000 | 21 | −2 |
| Example 3 | 58.3 | 5.7 | 64.0 | 36.0 | 0.098 | 850 | 2 | 13000 | 18 | 8 |
| Example 4 | 56.5 | 2.0 | 58.5 | 41.5 | 0.035 | 890 | 4 | 22000 | 21 | −1 |
| Example 5 | 55.4 | 0.6 | 56.0 | 44.0 | 0.011 | 910 | 2 | 16000 | 24 | −9 |

FIG. 1

| | first chemical element group (wt%) | second chemical element group (wt%) | total of the first and second chemical element groups (wt%) | BaTi$_4$O$_9$ (wt%) | second chemical element group / first chemical element group | firing condition temp. (°C) | firing condition time (hour) | Q-value at 1 GHz | relative dielectric constant at 1 GHz | τf at 1 GHz (ppm/°C) |
|---|---|---|---|---|---|---|---|---|---|---|
| Example 6 | 54.0 | 2.0 | 56.0 | 44.0 | 0.037 | 890 | 2 | 14000 | 22 | −6 |
| Example 7 | 51.0 | 5.0 | 56.0 | 44.0 | 0.098 | 870 | 2 | 10000 | 20 | 5 |
| Example 8 | 47.5 | 0.5 | 48.0 | 52.0 | 0.011 | 920 | 2 | 15000 | 28 | −10 |
| Example 9 | 46.3 | 1.7 | 48.0 | 52.0 | 0.037 | 910 | 2 | 12000 | 26 | −7 |
| Example 10 | 43.7 | 4.3 | 48.0 | 52.0 | 0.098 | 900 | 2 | 9000 | 23 | 0 |

FIG. 2

|  | first chemical element group (wt%) | second chemical element group (wt%) | BaTi$_4$O$_9$ (wt%) | second chemical element group / first chemical element group | firing condition | | Q-value at 1 GHz | relative dielectric constant at 1 GHz | τf at 1 GHz (ppm/°C) |
|---|---|---|---|---|---|---|---|---|---|
|  | total of the first and second chemical element groups (wt%) |  |  |  | temp. (°C) | time (hour) |  |  |  |
| Comparative Example 1 | 55.6 | 0.4 | 44.0 | 0.007 | 930 | >10 | not sintered | | |
|  | 56.0 | | | | | | | | |
| Comparative Example 2 | 50.0 | 6.0 | 44.0 | 0.012 | 860 | 2 | 6000 | 18 | 23 |
|  | 56.0 | | | | | | | | |
| Comparative Example 3 | 46.0 | 10.0 | 44.0 | 0.217 | 830 | 2 | 1000 | 14 | 50 |
|  | 56.0 | | | | | | | | |
| Comparative Example 4 | 71.0 | 1.0 | 28.0 | 0.014 | 890 | 2 | 7000 | 13 | 40 |
|  | 72.0 | | | | | | | | |
| Comparative Example 5 | 62.0 | 5.0 | 33.0 | 0.081 | 850 | 2 | 5000 | 11 | 70 |
|  | 67.0 | | | | | | | | |

FIG. 3

| | first chemical element group (wt%) | second chemical element group (wt%) | total of the first and second chemical element groups (wt%) | BaTi$_4$O$_9$ (wt%) | second chemical element group / first chemical element group | firing condition temp. (°C) | firing condition time (hour) | Q-value at 1 GHz | relative dielectric constant at 1 GHz | τf at 1 GHz (ppm/°C) |
|---|---|---|---|---|---|---|---|---|---|---|
| Comparative Example 6 | 41.0 | 2.0 | 43.0 | 57.0 | 0.049 | 910 | 3 | 2500 | 28 | −38 |
| Comparative Example 7 | 29.5 | 0.5 | 30.0 | 70.0 | 0.017 | 930 | >10 | not sintered | | |
| Comparative Example 8 | 31.0 | 3.0 | 34.0 | 66.0 | 0.097 | 920 | 2 | 2000 | 33 | −44 |

FIG. 4

DIELECTRIC CERAMIC COMPOSITION

BACKGROUND OF THE INVENTION

1. Field of the Invention

The present invention relates to a dielectric ceramic composition containing an oxide of a barium titanate family, and more particularly to a dielectric ceramic composition suitably used for materials constituting electronic components that operate in a microwave (a few GHz) region.

2. Description of Related Art

A dielectric ceramic composition has been widely used for an electronic circuit board, electronic components or the like. In recent years, as electronic equipments such as a mobile communication equipment typified by a portable telephone have been becoming more and more prevalent in the world and demand for high performance of such equipments has been enhanced, the use of dielectric ceramic composition is becoming increasingly necessary for RF (Radio Frequency) circuit components contained in such electronic equipments.

A dielectric ceramic composition used for radio frequency circuit components is desired to provide superiority in electrical properties such as dielectric characteristics and temperature dependence of the resonance frequency (electrostatic capacitance). In more detail, the following electrical properties are required for said dielectric ceramic composition. That is, for example, at 1 GHz, relative dielectric constant is about 18 to 30, Q value is as high as about 8000 or more (in other words, dielectric loss is small), and the temperature dependence of the resonance frequency satisfies NPO characteristics defined by the EIA standard while change of the resonance frequency is required to be within ±10 ppm/° C. over a temperature range from −25° C. to 85° C. centered on about 25° C. In addition, recently, the dielectric ceramic composition is in many cases sintered together with a metal wiring pattern to manufacture electronic components such as a multi-layer antenna (MLA) and a RF module, and further, demand for low-price electronic components has been growing. In order to meet such manufacture trend and address such demand, even in a case where a low-cost material such as silver (Ag: its melting point is about 961° C.) and cupper (Cu: its melting point is about 1083° C.) is used for formation of the metal wiring pattern, the dielectric ceramic composition has to be sintered at temperatures lower than melting point of such a low-cost material so as not to make the material melt.

It has been known that a dielectric ceramic composition having superior electrical properties and used for radio frequency circuit is realized by, for example, the material of the BaO—MgO—$Ta_2O_5$—$MnO_2$ family such as $Ba(Mg_{1/3}, Ta_{2/3})O_3$ and $Ba(Mn_{1/2}, Ta_{1/2})O_3$, the material of the MgO—$TiO_2$—CaO family such as $(Mg_{0.95}, Ca_{0.05})TiO_3$, and the material formed by substituting part of titanium (Ti) of $BaTi_4O_9$ for strontium (Sr) and then adding a predetermined amount of magnesium (Mg). However, all of those compositions include disadvantages. That is, those compositions have to be sintered at temperatures equal to or higher than 1250° C. and therefore, cannot be sintered together with the above-stated low-cost materials used for formation of metal wiring pattern.

In addition, although it is known that a material formed by adding tin (Sn), zirconium (Zr), boron (B), lithium (Li), etc., to the MgO—$TiO_2$—CaO family can be employed as a dielectric ceramic composition used for high frequency circuit, which ceramic composition can be sintered at low temperatures, i.e., 900° C. to 1050° C., this composition is inferior in electrical properties, particularly, Q value. Furthermore, problems have been found in some compositions that can be sintered at low temperatures. That is, such compositions often include lead (Pb) and therefore, adversely affect the environment while deteriorating their electrical properties.

In consideration of those problems, a new dielectric ceramic composition has been conceived and is disclosed in Japanese Patent Application Laid-open No. 2000-281442, in which the dielectric ceramic composition is formed by substituting part of titanium (Ti) of $BaTi_4O_9$ for zirconium and adding a predetermined amount of zinc (Zn), boron, lithium, calcium (Ca), silicon (Si), silver and copper to said substituted $BaTi_4O_9$. However, the dielectric ceramic composition formed as described above cannot sufficiently satisfy the above-stated requirement for temperature dependence of the resonance frequency. In addition, since the dielectric ceramic composition includes a total of $B_2O_3$ and $Li_2CO_3$ over approximately 6 wt % and $B_2O_3$ enhances vitrification (amorphization) of compound consisting of each of the above-stated elements, lithium included in the composition in a glass state easily exhibits ion conduction, likely causing deterioration of electrical isolation necessary for the composition.

In addition to the above-mentioned problems, the dielectric ceramic composition disclosed in Japanese Patent Application Laid-open No. 2000-281442 indicates another problem. That is, the dielectric ceramic composition includes a large amount of $B_2O_3$ and $Li_2CO_3$, both of which are apt to react with water from the air, and therefore, exhibits low chemical durability, which property is unfavorable for reliability of dielectric ceramic composition.

SUMMARY OF THE INVENTION

In consideration of the above-described problems included in the conventional technique, the present invention has been conceived and therefore, a first object of the present invention is to provide a dielectric ceramic composition that can be sintered at low temperatures and offer superiority in electrical properties, particularly, temperature dependence of the resonance frequency. A second object of the present invention is to provide a dielectric ceramic composition that exhibits superior chemical durability.

A dielectric ceramic composition according to the present invention comprises an oxide containing barium (Ba), titanium (Ti) and oxygen (O), and having a composition formula represented as $BaTi_xO_{2x+1}$ ($3.5 \leq x \leq 5.0$); a first chemical element group consisting of at least one kind of alkaline-earth metals, silicon, zinc, aluminium (Al), titanium, copper, bismuth (Bi) and molybdenum (Mo); a second chemical group consisting of at least one kind of alkali metals and boron, in which a weight ratio of a total of respective chemical elements in the first and second chemical element groups to the oxide (the total of respective chemical elements/the oxide) is between 45/55 and 65/35 inclusive when the ratio is determined by converting the respective chemical elements to their oxides, a weight ratio of the second chemical element group to the first chemical element group (the second chemical element group/the first chemical element group) is between 0.01 and 0.10 inclusive when the ratio is determined by converting the respective chemical elements to their oxides. It should be noted that the words, "when the ratio is determined by converting the respective chemical elements to their oxides," means the case where weight of each of the chemical elements is converted to weight of its oxide.

The above-described dielectric ceramic composition may contain magnesium, calcium, strontium and barium as the alkaline-earth metals. The dielectric ceramic composition may contain at least lithium as the alkali metal.

With the dielectric ceramic composition according to the present invention, since a weight ratio of a total of respective chemical elements in the first and second chemical element groups to the oxide is between 45/55 and 65/35 inclusive when the ratio is determined by converting the respective chemical elements to their oxides, and further, a weight ratio of the second chemical element group to the first chemical element group is between 0.01 and 0.10 inclusive when the ratio is determined by converting the respective chemical elements to their oxides, the sintering temperature for the dielectric ceramic composition can be lowered and the dielectric ceramic composition is able to have superior electrical properties, more specifically, have a desired relative dielectric constant and a high Q value while offering superior temperature dependence of the resonance frequency. The chemical durability of the composition can be improved. Since the composition can be manufactured using pure water as a solvent instead of an organic solvent, the manufacturing steps employed to obtain the invented composition can contribute to protection of the environments.

BRIEF DESCRIPTION OF THE DRAWINGS

FIG. 1 is a table showing the constructions of dielectric ceramic compositions associated with the examples 1 through 5 of the present invention and the results obtained by measuring characteristics of each of the compositions.

FIG. 2 is a table showing the constructions of dielectric ceramic compositions associated with the examples 6 through 10 of the present invention and the results obtained by measuring characteristics of each of the compositions.

FIG. 3 is a table showing the constructions of dielectric ceramic compositions associated with the comparative examples 1 through 5 and the results obtained by measuring characteristics of each of the compositions.

FIG. 4 is a table showing the constructions of dielectric ceramic compositions associated with the comparative examples 6 through 8 and the results obtained by measuring characteristics of each of the compositions.

DESCRIPTION OF THE PREFERRED EMBODIMENT(S)

Preferred embodiments of the present invention will be explained in detail below.

A dielectric ceramic composition (hereinafter, also referred to as simply a composition) in accordance with an embodiment of the present invention is used for various kinds of filters, duplexers, dielectric antennas or various kinds of passive components employing the so-called LTCC (Low Temperature Co-fired Ceramics) technique. With this LTCC technique a multilayer substrate with internal conductors is obtained. The conductors can be patterned in known manner to define inductors, striplines, interconnects, capacitor electrodes and the like. The dielectric ceramic composition contains an oxide of a barium titanate family having a composition formula represented as $BaTi_xO_{2X+1}$ ($3.5 \leq x \leq 5.0$). The reason why "x" has to be limited within the above-described range is as follows. That is, in a case where "x" is smaller than 3.5, the composition loses paradielectric property and substantially has ferroelectric property, and therefore, Q value in a microwave region becomes extremely small. On the other hand, in a case where "x" is larger than 5.0, the composition has to be sintered at higher temperatures and therefore, is hardly sintered at temperatures lower than melting point of silver (for example, equal to or lower than 930° C.). Note that "x" is preferably between 3.8 and 4.4 inclusive.

The dielectric ceramic composition also contains a first chemical element group consisting of at least one kind of alkaline-earth metals, silicon, zinc, aluminium, titanium, copper, bismuth and molybdenum. Included as the alkaline-earth metals are, for example, magnesium, calcium, strontium and barium. The dielectric ceramic composition further contains a second chemical group consisting of at least one kind of alkali metals and boron. Included as the alkaline metals are, for example, lithium and sodium.

In the dielectric ceramic composition of the present invention, a weight ratio of a total of respective chemical elements in the first and second chemical element groups to the oxide (the total of respective chemical elements/the oxide) is selected between 45/55 and 65/35 inclusive when the ratio is determined by converting the respective chemical elements to their oxides. The reason is as follows: in a case where the larger amount of the oxide than the maximum in the ratio is contained in the composition, Q value becomes small and the composition has to be sintered at higher temperatures; and contrary to it, in a case where the smaller amount of the oxide is contained in the composition, a relative dielectric constant becomes small. The ratio is preferably between 50/50 and 60/40 and more preferably between 53/47 and 58/42. It should be noted that those ratios are optionally changed depending on a situation in which the composition is to be used.

In the composition, a weight ratio of the second chemical element group to the first chemical element group (the second chemical element group/the first chemical element group) is selected between 0.01 and 0.10. The reason is that in general, in a case where the composition indicates a high degree of elaborateness and crystallinity, Q value becomes larger and in a case where the ratio is within the above-described range, the composition exhibits superiority in both elaborateness and crystallinity while having large Q value. The ratio is preferably between 0.02 and 0.08 and more preferably between 0.03 and 0.06.

In a case where the ratio (the second chemical element group/the first chemical element group) falls outside the above-describe range, the following problems occur. When the ratio of the second chemical element group, i.e., alkali metals and boron, to the first chemical element group is made larger than necessary, vertification of the first chemical element group is enhanced and therefore, the composition loses its crystallinity. In addition, as is explained in the description of the conventional technique, the vertified composition allows lithium included in the composition to easily exhibit ion conduction, likely causing deterioration of electrical isolation and electrical durability necessary for the composition. On the other hand, when the composition contains an extremely small amount of alkali metals and boron, the composition has to be sintered at higher temperatures and therefore, when the composition is sintered at low temperatures, the composition loses its elaborateness. As a result, the composition has a smaller Q value and hygroscopic property, decreasing its electrical isolation capability. Furthermore, when the composition contains a large amount of lithium as alkali-metals and is processed with pure water as a solvent at the time of manufacture of the composition, a lithium compound reacts with pure water generating heat, which phenomenon adversely effects mass productivity in relation to the composition and deteriorates wet mixing uniformity associated with the manufacture of the composition, and therefore, it is inevitable that the composition is manufactured by using an organic solvent, resulting in adverse affect on the environment.

In the first chemical group, silicon serves to make the composition have higher Q value, lower relative dielectric constant and negative value temperature dependence of the resonance frequency (hereinafter, temperature dependence of the resonance frequency is referred to as also τf). Furthermore, for example, $SiO_2$ whose melting point is very high (about 1800° C.) can be employed as a starting material of silicon at the time of manufacture of the composition and when $SiO_2$ is contained more than necessary in the composition, temperatures at which the composition is to be sintered unfavorably become high. Accordingly, in order for the composition to have desired electrical properties and be desirably sintered at associated temperatures, a ratio of silicon to a total of respective chemical elements in the first chemical group is preferably made ranging from 15.0 to 40.0 wt % inclusive when the ratio is determined by converting the respective chemical elements to their oxides. Thus, the composition is preferably made to contain $SiO_2$ at the time of manufacture of the composition such that a ratio of $SiO_2$ to a total of the starting materials for the first chemical group is made ranging from 15.0 to 40.0 wt %. In addition, the ratio is more preferable made ranging from 18.0 to 30.0 wt %. It should be noted that $SiO_2$ is preferably formed to have a mean grain diameter equal to or less than 50 nm. The reason is that the mean grain diameter of $SiO_2$ is an element that largely affects the degree of sintering of the composition and when the diameter is equal to or less than 50 nm, the composition can easily be sintered, lowering temperatures at which the composition is to be sintered.

Zinc serves to make the composition have lower Q value, higher relative dielectric constant and negative value τf. For example, ZnO can be employed as a starting material of zinc in the composition. Since ZnO reacts with $SiO_2$ and later-described $Al_2O_3$ as a starting material of aluminium to form liquid phase at low temperatures (for example, about 850° C.), the composition can advantageously be sintered at low temperatures by making the composition contain an appropriate amount of ZnO at the time of manufacture of the composition. In order for the composition to have desired electrical properties and be desirably sintered at associated temperatures, the composition is preferably made to contain ZnO such that a ratio of ZnO to a total of the starting materials for the first chemical group is made ranging from 18.0 to 48.0 wt % and more preferably ranging from 22.0 to 38.0 wt %.

Aluminium serves to make the composition have higher Q value, lower relative dielectric constant and negative value τf. For example, $Al_2O_3$ can be employed as a starting material of aluminium in the composition and melting point of $Al_2O_3$ is very high (about 2000° C.). Accordingly, when the composition is made to contain $Al_2O_3$ more than necessary, the composition has to be sintered at higher temperatures, resulting in unfavorable phenomenon similar to that observed by employing the above-stated $SiO_2$ in the composition. In order for the composition to have desired electrical properties and be desirably sintered at associated temperatures, the composition is preferably made to contain $Al_2O_3$ such that a ratio of $Al_2O_3$ to a total of the starting materials for the first chemical group is made ranging from 5.0 to 14.0 wt % and more preferably ranging from 6.0 to 12.0 wt %.

Titanium serves to make the composition have higher Q value, higher relative dielectric constant and large positive value τf. As is the case with the above-described silicon, zinc and aluminium, in general, a component that serves to make the composition have higher Q value serves to make the composition have lower relative dielectric constant and negative value τf. Therefore, titanium is effective in adjusting relative dielectric constant and τf of the composition. The composition is preferably made to contain titanium such that a ratio of titanium to a total of respective chemical elements in the first chemical group is made ranging from 5.0 to 15.0 wt % inclusive when the ratio is determined by converting the respective chemical elements to their oxides, and is preferably made to contain a starting material of titanium (for example, $TiO_2$) at the time of manufacture of the composition such that the ratio of the starting material of titanium to a total of respective starting materials for the first chemical group falls within the above-described range. It is because when the ratio becomes lower than 5.0 wt %, the capability of titanium to adjust τf of the composition is decreased and when the ratio exceeds 15.0 wt %, temperatures at which the composition is to be sintered become higher, and when the ratio falls within the above-described range, the composition is able to have desired electrical properties and be sintered at a desired temperature. The ratio is more preferably made ranging from 6.0 to 13.0 wt %.

CuO can, for example, be employed as a starting material of copper in the composition and CuO is advantageously able to lower temperatures to an extreme extent at which the composition is to be sintered. It is because melting point of CuO (about 1148° C.) is lower than those of starting materials of other elements that constitute the composition and an eutectic point of those materials can be lowered by adding CuO to the starting materials. It should be noted that copper serves to make the composition have lower Q value and large negative value τf. In order for the composition to have desired electrical properties and be desirably sintered at associated temperatures, the composition is preferably made at the time of manufacture of the composition to contain CuO such that a ratio of CuO to a total of respective starting materials for the first chemical group is made ranging from 0.2 to 8.0 wt % and more preferably ranging from 0.8 to 4.0 wt %.

Bismuth serves to make the composition have lower Q value and negative value τf. $Bi_2O_3$ can, for example, be employed as a starting material of bismuth and this starting material is advantageously able to lower temperatures at which the composition is to be sintered, which ability is explained in the description of the starting material of copper. The melting point of $Bi_2O_3$ is about 820° C. In order for the composition to have desired electrical properties and be desirably sintered at associated temperatures, the composition is preferably made to contain bismuth such that a ratio of bismuth to a total of respective chemical elements in the first chemical group is made not greater than 8.0 wt % inclusive when the ratio is determined by converting the respective chemical elements to their oxides and more preferably not greater than 6.0 wt % inclusive.

Molybdenum serves to make the composition have higher Q value, higher relative dielectric constant and positive value τf. As is already mentioned, elements capable of making the composition have higher Q value and at the same time, positive value τf are scarcely found and therefore, molybdenum is so effective element in the embodiment. $MoO_3$ can, for example, be employed as a starting material of molybdenum and this starting material also has the low melting point (about 800° C.), allowing the composition to be sintered at a sufficiently lower temperature. In order for the composition to have desired electrical properties and be desirably sintered at associated temperatures, the composition is preferably made at the time of manufacture of the composition to contain the starting material of molybdenum such that a ratio of the molybdenum's starting material to a total of respective starting materials for the first chemical group is made ranging from 3.0 to 18.0 wt % and more preferably ranging from 5.0 to 14.0 wt %.

Magnesium as one of alkaline-earth metals can advantageously be contained in the composition since it is capable of making the composition have higher Q value. MgO can, for example, be employed as a starting material of magnesium. MgO melts at an extremely high temperature (about 2800° C.) and therefore, when the composition contains a large amount of MgO, the composition unfavorably has to be sintered at higher temperatures. The composition is preferably made to contain magnesium such that a ratio of magnesium to a total of respective chemical elements in the first chemical group is made ranging from 0.2 to 4.5 wt % and more preferably ranging from 0.5 to 4.0 wt % inclusive when the ratio is determined by converting the respective chemical elements to their oxides. It should be noted that, for example, $MgCO_3$ may alternatively be employed as a starting material of magnesium.

As is already described, the dielectric ceramic composition in accordance with the embodiment contains barium, strontium, calcium, etc., as the alkaline-earth metals other than magnesium. Those elements can advantageously be contained in the composition since operation for heating starting materials of those elements together with starting materials of other elements of the first chemical group makes it possible to lower temperatures at which the composition is to be sintered. $BaCO_3$, $SrCO_3$ and $CaCO_3$ can, for example, be employed as starting materials of barium, strontium and calcium, respectively.

Since $BaCO_3$, in more detail, reacts with another starting material (for example, $Al_2O_3$) of the first chemical group at low temperatures, $BaCO_3$ effectively serves as a sintering agent to prompt the composition to be sintered at low temperatures. However, $BaCO_3$ itself has the high melting point (about 1920° C.). Barium serves to make the composition have negative value τf in cooperation with the oxide of the barium titanate family. In order for the composition to have desired electrical properties and be desirably sintered at associated temperatures, the composition is preferably made at the time of manufacture of the composition to contain $BaCO_3$ such that a ratio of $BaCO_3$ to a total of respective starting materials for the first chemical group is made ranging from 7.5 to 14.0 wt % and more preferably ranging from 8.0 to 13.0 wt %. For example, BaO may be alternatively employed as a starting material of barium.

$SrCO_3$ and $CaCO_3$, in more detail, react with alkali metal compound, etc., at high temperatures to form liquid phase, serving as a sintering agent to prompt materials in the liquid phase to move. In order for the composition to have desired electrical properties and be desirably sintered at associated temperatures, the composition is preferably made at the time of manufacture of the composition to contain $SrCO_3$ such that a ratio of $SrCO_3$ to a total of starting materials for the first chemical group is made ranging from 3.0 to 9.0 wt % and more preferably ranging from 4.0 to 8.0 wt %. With regard to $CaCO_3$, the composition is preferably made to contain $CaCO_3$ such that a ratio of $CaCO_3$ to a total of starting materials for the first chemical group is made ranging from 0.1 to 3.0 wt % and more preferably ranging from 0.1 to 2.0 wt %. The starting materials for strontium and calcium are not limited respectively to $SrCO_3$ and $CaCO_3$, and may alternatively be SrO and CaO, respectively.

With regard to the second element group, when alkali metals are sintered together with the first element group, particularly, silicon, alkaline-earth metals and boron, alkali metals preferably serve as a sintering agent, allowing the general composition to be sintered at lower temperatures. Included as starting materials of such alkali metals are the lithium compounds such as $Li_2CO_3$ and $Li_2O$ and the sodium compounds such as $Na_2CO_3$ and $Na_2O$, and it is preferable to employ at least lithium compounds out of those materials in the composition. As is already described, containing lithium and sodium more than necessary in the composition unfavorably serves to make the composition have lower Q value and further, deteriorated electrical and chemical endurance properties. A ratio of lithium to a total of respective chemical elements in the second chemical group is preferably made ranging from 8.0 to 25.0 wt % inclusive when the ratio is determined by converting the respective chemical elements to their oxides. A ratio of sodium to a total of respective chemical elements in the second chemical group is preferably made ranging from 0 to 15.0 wt % inclusive when the ratio is determined by converting the respective chemical elements to their oxides.

Boron is advantageously able to lower temperatures at which the composition is to be sintered. In more detail, for example, $B_2O_3$ is employed as starting material of boron and when $B_2O_3$ is sintered together with starting materials of the fist element group, particularly, together with starting materials of silicon and alkaline-earth metals, $B_2O_3$ serves as a sintering agent, allowing the general composition to be sintered at lower temperatures. However, when the starting materials containing a large amount of boron's starting material are sintered, a compound (boron silicate glass) formed by the reaction boron with silicon and alkaline-earth metals produces foams while forming a number of closed pores in the composition and serves to make the composition have lower Q value and deteriorated electrical and chemical endurance properties. Therefore, it is not preferable to contain the starting material of boron in the composition more than necessary. A ratio of boron to a total of respective chemical elements in the second chemical group is preferably made ranging from 60.0 to 92.0 wt % inclusive when the ratio is determined by converting the respective chemical elements to their oxides.

Examples of the present invention will be explained in detail below with reference to the accompanying drawings.

EXAMPLES 1 THROUGH 10

First, the both powders of $BaCO_3$ and $TiO_2$ were prepared and weighed so that the molar ratio of these oxides becomes $BaCO_3:TiO_2=1:4$. Pure water as a solvent was then added to the oxides, which were wet-mixed in a ball mill with the aid of zirconia beads for 3 hours and sufficiently dried. Subsequently, the mixture thus obtained was pre-sintered at 1100° C. for 2 hours, wet-ground by using pure water as a solvent and zirconia beads, and then sufficiently dried. Thus, a compound containing titanium was obtained.

All of the powders of $SiO_2$, ZnO, $Al_2O_3$, $TiO_2$, CuO, $Bi_2O_3$, $MoO_3$, MgO, $BaCO_3$, $SrCO_3$ and $CaCO_3$ as starting materials of the first element group were also prepared and weighed so that the molar ratio of these oxides is selected as desired. The oxides were then pre-sintered in the same manner as that of $BaCO_3$ and $TiO_2$ except that the pre-sintering temperature was 820° C. All of the powders of $B_2O_3$, $Li_2CO_3$ and $Na_2CO_3$ as starting materials of the second element group were further prepared and weighed so that the molar ratio of these oxides is selected as desired. In weighing the starting materials of the first and second element groups, in the examples 1 through 10, a weight ratio of starting materials of the second element group to starting materials of the first element group was changed as shown in FIGS. 1 and 2.

Thereafter, the compound containing titanium, the starting materials (pre-sintered) of the first element group and the starting materials of the second element group were weighed, wet-mixed with the addition of pure water as a solvent to the oxides and the aid of zirconia beads, and then sufficiently dried. In weighing described above, in the examples 1 through 10, a weight ratio of $BaTi_4O_9$ to the starting materials of the first and second element groups was changed as shown in FIGS. 1 and 2. It should be noted that the ratio is a ratio calculated by converting the respective chemical elements of the first and second element groups to their oxides.

Subsequently, polyvinyl alcohol (PVA) as a binder was added to the mixture thus obtained to effect granulation. The granulated mixture was filled into a mold, and then, subjected to the molding pressure of 3 ton/cm by using a press molding machine to thereby obtain a cylinder-shaped sample having a diameter of 12.0 mm and a thickness of 12.0 mm. The sample thus obtained was then sintered in air to obtain a dielectric ceramic composition. In the examples 1 through 10, sintering temperature and sintering time were changed as shown in FIGS. 1 and 2.

As comparative examples 1 through 8 relative to the examples 1 through 10, samples are prepared and sintered using the same steps as those performed to prepare the examples 1 through 10 except that the weight ratios between $BaTi_4O_9$, the first element group and second element group, and sintering conditions were changed, all of which are indicated in FIGS. 3, 4. As a result, the comparative examples 1 and 7 were not being sintered. Incidentally, the comparative examples 1 through 3 indicate that a weight ratio of the second chemical element group to the first chemical element group (the second chemical element group/the first chemical element group) is lower than 0.01 or greater than 0.10. The comparative examples 4 through 8 indicate that a weight ratio of a total of respective chemical elements in the first and second chemical element groups to the oxide ((the first chemical element group plus the second chemical element group)/the oxide) is lower than 45/55 or greater than 65/35.

With respect to each of the dielectric ceramic compositions manufactured through the above-mentioned preparation of the examples 1 through 10 and the comparative examples 2 through 6 and 8, a relative dielectric constant in a microwave region was obtained using a TEM resonance technique. Additionally, Q value at 1 GHz was obtained by housing the dielectric ceramic composition in a cavity and measuring resonance peak frequency in a TEM mode. Furthermore, temperature dependence of the resonance frequency at 1 GHz was obtained using a strip line resonator. The resultant measured values are indicated in FIGS. 1 through 4. The temperature dependence was measured at −25° C. to +85° C. and indicated by a rate of change (ppm/° C.) with reference to the value at +25° C.

As can be seen in FIGS. 1 through 4, all of the examples each indicated superiority in three electrical properties, i.e., the Q value of 9000 to 22000, the relative dielectric constant of 18 to 28 and the τf of −10 to 8 ppm/° C. On the contrary, each of the comparative examples did not satisfy at least one of the numerical values representing the desired three electrical properties, which are explained in the chapter of "Prior Art." In addition, it became clear that all of the examples are to be sintered at temperatures not higher than 920° C. and can be sintered together with silver, copper and the like. That is, it can be concluded that the dielectric ceramic composition in accordance with the present invention is to be sintered at low temperatures and has superior electrical properties.

Although not shown in detail, even in a case where an oxide of a barium titanate family does not have a stoichiometric composition, but has a composition formula represented as $BaTi_xO_{2x+1}$ ($3.5 \leq x \leq 5.0$), the composition prepared in accordance with the present invention provides the same effects as those explained in the description of the examples. Even in a case where, with regard to each of the elements in the first and second element groups, any form of compound other than the above-described oxides or carbonates is employed as the starting materials of the first and second element groups, the composition prepared in accordance with the present invention and employing such another compound provides the same effects as those explained in the description of the examples. In addition, it was proved that the composition indicates superior electrical properties to a larger extent when the mean particle size of $SiO_2$ as the starting materials of silicon is not longer than 50 nm.

Although the present invention has been explained with reference to the embodiment and examples thereof, it will be understood that the present invention is not limited to those embodiment and examples but can be modified differently without departing from the spirit and scope of the objects of the present invention. For instance, although, in the above-described examples, all of the starting materials of the first element group are mixed and pre-sintered, bismuth compounds and molybdenum compounds out of all of the starting materials of the first element group are not necessarily pre-sintered and therefore, the dielectric ceramic composition of the present invention can be also obtained by mixing those compounds with, for example, the starting materials of the second element group to manufacture the composition.

What is claimed is:

1. A dielectric ceramic composition comprising: an oxide containing barium (Ba), titanium (Ti) and oxygen (O), and having a composition formula represented as $BaTi_xO_{2x+1}$ ($3.5 \leq x \leq 5.0$);
    a first chemical element group consisting of at least one kind of alkaline-earth metals, silicon (Si), zinc (Zn), aluminium (Al), titanium, copper (Cu), bismuth (Bi) and molybdenum (Mo); and
    a second chemical element group consisting of at least one kind of alkali metals and boron (B),
    a weight ratio of a total of respective chemical elements in the first and second chemical element groups to the oxide (the total of respective chemical elements/the oxide) being between 45/55 and 65/35 inclusive when the ratio is determined by converting said respective chemical elements to their oxides, a weight ratio of the second chemical element group to the first chemical element group (the second chemical element group/the first chemical element group) being between 0.01 and 0.10 inclusive when the ratio is determined by converting said respective chemical elements to their oxides.

2. A dielectric ceramic composition as claimed in claim 1, wherein the first chemical element group includes magnesium (Mg), calcium (Ca), strontium (Sr) and barium (Ba) as said alkaline-earth metals, and the second chemical element group includes at least lithium (Li) as said alkali metal.

3. An electrical element comprising a dielectric composition and at least one electrode, characterized in that according to claim 1 is present the dielectric composition.

4. An electrical element according to claim 3, characterized in that it is an antenna.

5. An electric element according to claim 3, characterized in that it is a Low-Temperature Co-firing Ceramic (LTCC) substrate provided with internal conductors.

* * * * *